(12) United States Patent
Goto (10) Patent No.: US 7,820,978 B2
(45) Date of Patent: Oct. 26, 2010

(54) CHARGED-PARTICLE BEAM SYSTEM

(75) Inventor: Kazuya Goto, Tokyo (JP)

(73) Assignee: JEOL Ltd., Tokyo (JP)

( * ) Notice: Subject to any disclaimer, the term of this patent is extended or adjusted under 35 U.S.C. 154(b) by 403 days.

(21) Appl. No.: 11/959,966

(22) Filed: Dec. 19, 2007

(65) Prior Publication Data

US 2008/0142723 A1    Jun. 19, 2008

(30) Foreign Application Priority Data

Dec. 19, 2006    (JP)    ............... 2006-341754

(51) Int. Cl.
    *H01J 3/14*    (2006.01)
(52) U.S. Cl. ............... 250/396 R; 250/396 ML
(58) Field of Classification Search ............. 250/396 R, 250/396 ML
    See application file for complete search history.

(56) References Cited

U.S. PATENT DOCUMENTS 5,831,270 A  *  11/1998  Nakasuji  .............. 250/396 ML
2007/0158563 A1     7/2007  Goto

FOREIGN PATENT DOCUMENTS

JP    59-83336    5/1984

OTHER PUBLICATIONS

Teruo Hosokawa, "Systematic elimination of third order aberrtions in electron beam scanning system," Optik, vol. 56, No. 1 (1980), pp. 21-30.

* cited by examiner

Primary Examiner—Jack I Berman
Assistant Examiner—Hanway Chang
(74) Attorney, Agent, or Firm—The Webb Law Firm (57) ABSTRACT

A charged-particle beam system has a demagnifying lens for reducing the dimensions of an electron beam produced from an electron beam source, an objective lens for focusing the demagnified beam onto the surface of a target, a first deflector located before the demagnifying lens, a second deflector placed such that the deflection field produced by it is totally or partially superimposed on the objective lens field, and a third deflector located in a stage following the second deflector. An image of the light source is created by the demagnifying lens. An image of the light source image is formed on the target by the objective lens.

5 Claims, 7 Drawing Sheets

CHARGED-PARTICLE BEAM SYSTEM

BACKGROUND OF THE INVENTION

1. Field of the Invention

The present invention relates to a charged-particle beam system, such as an electron beam lithography system or a scanning electron microscope.

2. Description of Related Art

Figure 1:
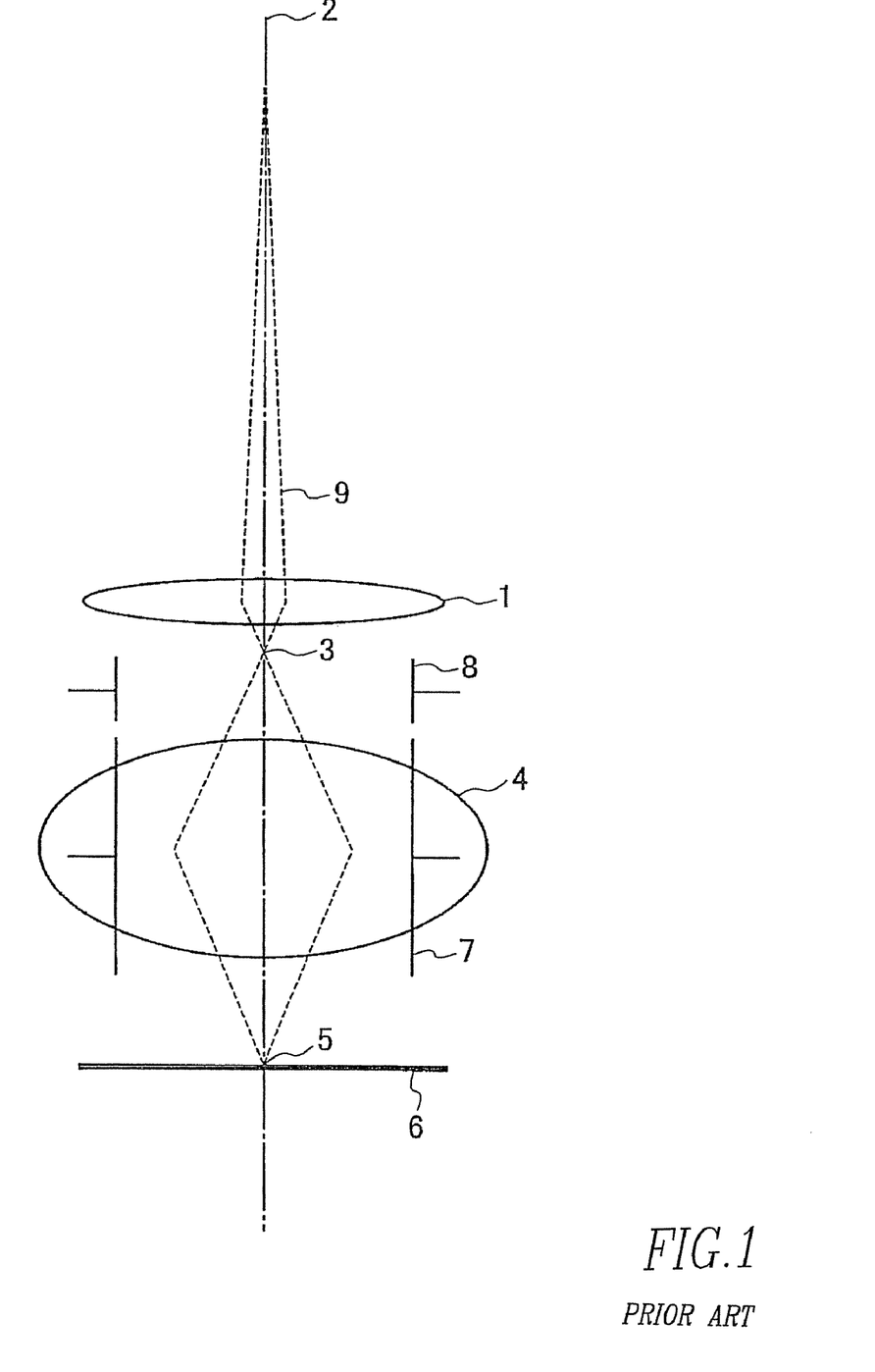
FIG. 1 is a schematic diagram of a prior art electron beam lithography system.

FIG. 1 schematically shows one example of a part of an electron beam lithography system. In this system, an image 3 of a beam source 2 is formed by a demagnifying lens 1. An image 5 of the image 3 is formed on the surface of a material 6 by an objective lens 4. Under this condition, if a deflector 7 is operated to deflect an electron beam 9, the image 5 can be moved into a desired position. Of course, the magnification (absolute value) of the demagnifying lens 1 is smaller than 1 because the electron beam (i.e., the image 5) of microscopic cross section should be focused onto the material 6. Where a high deflection speed should be obtained, an electrostatic deflector is used as the deflector 7.

Where a second deflector 8 is mounted in addition to the first-mentioned deflector 7 such that a multi-stage deflection system is constituted as shown in FIG. 1, the image 5 can be moved into a desired position while correcting deflection aberrations (e.g., deflection comatic aberration and deflection chromatic aberration). At this time, a deflection field produced by the deflectors 7 and 8 and having a strength and a sense is so selected that deflection aberrations caused by the deflectors 7 and 8 cancel each other out. If the deflector 8 is located close to the image 3, and if the electrode length is small, the deflection sensitivity of the deflector 7 that is the ratio of the distance traveled by the image 5 on the surface of the material 6 to the deflection voltage is higher, while the deflection sensitivity of the deflector 8 is lower. In this case, roughly speaking, the deflection distance and the sense of deflection on the surface of the material 6 are dominated by the deflector 7. Meanwhile, the deflector 8 corrects aberrations due to the deflector 7.

The deflection sensitivity of the deflector 8 is low. This means that as the deflector 8 is located closer to an object point (in this case, the image 3), virtual movement of the object point (image 3) produced by deflection decreases.

If there are two interlocking deflectors, such as the deflectors 8 and 7 as shown in FIG. 1, there are two degrees of freedom. This means that it is possible to determine the position of the image 5 and, at the same time, correct one kind of deflection aberration.

T. Hosokawa in *Optik*, Vol. 56, No. 1, pp. 21-30 (1980), teaches that if three interlocking deflectors are used, there are three degrees of freedom and that it is possible to determine the position of the image 5 and to correct two kinds of aberrations. Furthermore, it is set forth in JP59-083336 that even when there are two interlocking deflectors, one kind of aberration can be corrected and, furthermore, a second kind of aberration can be reduced (though it cannot be completely corrected) by appropriately selecting the intensity distributions in the lens field and in the deflection field.

Incidentally, in the prior art charged-particle beam system, when a charged-particle beam is deflected over a surface of a target, aberrations have been produced. Aberrations caused by deflection include curvature of field aberration, astigmatism, distortion aberration, comatic aberration, and chromatic aberration. Of these aberrations, curvature of field aberration and astigmatism produced as deviations of the focus can be corrected dynamically by correctors. Furthermore, deflection distortion aberrations produced as positional deviations can be corrected by superimposing a correcting signal onto the deflection signal. These corrections for aberrations have been already generally made, for example, in electron beam lithography systems.

Therefore, if the comatic and chromatic aberrations are also corrected, the lithography accuracy will be improved greatly. It is assumed here that the geometrical figure projected onto the material 6 is sufficiently small. Hence, errors caused by the size of the figure are not taken into consideration.

In order to correct deflection comatic aberration and deflection chromatic aberration at the same time while determining the position of the image 5, three deflections may be interlocked to provide three degrees of freedom. However, any guidances on designing such an optical system have not yet been given. That is, any guidances relevant to optimization of the deflection field and lens field have not been given. Depending on operational conditions, problems such as excessively high deflection voltage take place. In order to lower the deflection voltage without varying the magnitude of deflection, it is better to increase the deflector length or to reduce the inside diameter of the deflectors. Normally, it is difficult to increase the deflector length because of spatial restrictions. Furthermore, reducing the inside diameter of the deflectors will produce some problems including adhesion of contaminants on the inner wall of the deflectors and charging. Consequently, it is better to avoid this approach.

A charged-particle beam system in which the deflection voltage can be suppressed to low levels without increasing the deflector length or reducing the inside diameter of the deflectors is disclosed in JP2007-188937 (US2007/0158563) filed by the present applicant.

Figure 2:
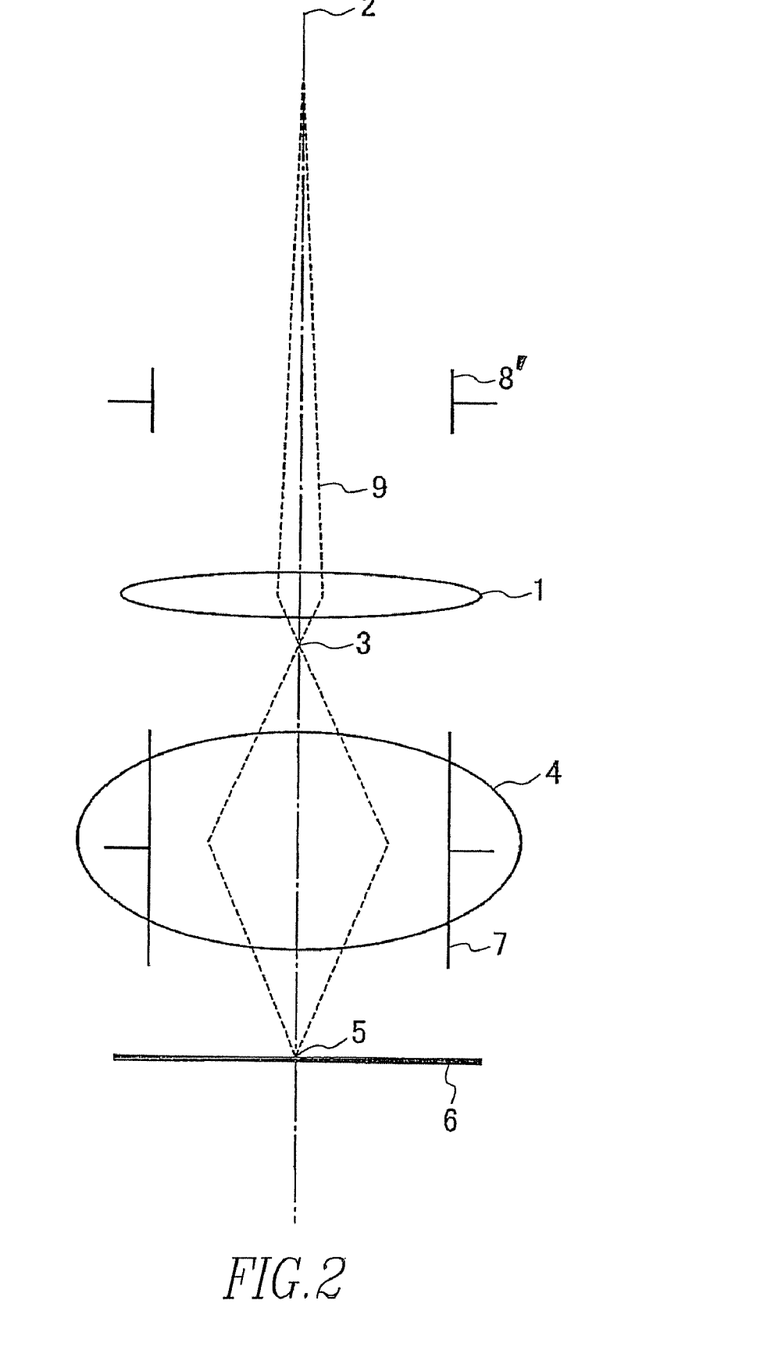
FIG. 2 is a schematic diagram of an electron beam lithography system having a deflector for aberration correction, the deflector being disposed in a stage preceding a demagnifying lens.

FIG. 2 illustrates the configuration of the charged-particle beam system. Those components of FIG. 2 which are identical with their counterparts of FIG. 1 are indicated by the same reference numerals as in FIG. 1. The system shown in FIG. 2 has an aberration-correcting deflector 8 located in a stage preceding the demagnifying lens 1. The deflection angle of the electron beam 9 is enlarged by making use of the focusing action of the lens.

However, even with this charged-particle beam system, the deflection voltages of all the deflectors may not be suppressed to low levels in cases where deflection comatic aberration and deflection chromatic aberration are simultaneously corrected. Where one kind of deflection aberration is corrected, positioning and correction of aberrations caused by the positioning can be assigned to two stages of deflectors, respectively. Where two kinds of deflection aberrations are corrected at the same time, three stages of deflectors are used. Therefore, in some cases, the effects of positioning or aberration correction made by some deflector are canceled by the effects of positioning or aberration correction made by another deflector.

In this case, it is necessary to increase the extent of the deflection performed by each deflector by an amount corresponding to the canceled amount of deflection for positioning or the amount of correction to deflection aberration (i.e., the angle through which the orbit of the electron beam 9 is swung rearwardly) in order to obtain a required magnitude of deflection. That is, the deflection voltage needs to be increased. Furthermore, the orbit is swung rearwardly through a large angle by strong deflection. This means that the orbit of the electron beam 9 more greatly deviates over a larger distance from the center axis of the lens. Consequently, there is another problem that other deflection aberrations, including field of curvature aberration, astigmatism, and distortion aberration, increase. Accordingly, even where this technique is used, it is necessary to more specifically determine the guidance on optimization of the design of the optical system that corrects deflection comatic aberration and deflection chromatic aberration at the same time.

It is set forth in the above-cited JP59-083336 that with the described optical system, one kind of aberration can be corrected and, furthermore, another kind of aberration can be reduced to a submicron level (where the deflection field measures 10 mm×10 mm) by using only two deflectors rather than three deflectors and operating them in an interlocking manner. However, it is impossible to completely correct the second kind of aberration. In the past, it has been recognized that there is no problem if beam blur due to deflection is reduced to a submicron level. In today's electron beam lithography, it is required that beam blur be reduced to nanometer levels or less and that, ideally, the beam blur be completely removed because of required high lithography accuracy.

SUMMARY OF THE INVENTION

It is an object of the present invention to provide a charged-particle beam system in which deflection comatic aberration and deflection chromatic aberration can be simultaneously corrected while determining a beam incidence position at the objective lens image plane without reducing the electrode inside diameter excessively and without increasing the deflection voltage excessively.

A charged-particle beam system, according to the present invention, is designed to be free from the foregoing problem and has: a charged-particle beam source for producing a charged-particle beam; a demagnifying lens for demagnifying dimensions of the charged-particle beam produced from the charged-particle beam source; an objective lens for focusing the charged-particle beam whose dimensions have been demagnified by the demagnifying lens onto a surface of a target; a first deflector disposed in a stage preceding the demagnifying lens or close to the object plane of the objective lens; a second deflector disposed such that a deflection field produced by the second deflector itself is totally or partially superimposed on the field produced by the objective lens; and a third deflector disposed in a stage following the second deflector.

Preferably, the intensity distribution in the deflection field is selected by adjusting the dimensions, positions, and deflection voltages of the first, second, and third deflectors such that deflection comatic aberrations arising from the deflectors cancel each other out and, at the same time, deflection chromatic aberrations due to the deflectors cancel each other out while determining the beam incidence position at the image plane of the objective lens.

Preferably, the same deflection signal is applied to the second and third deflectors while satisfying conditions under which the deflection comatic aberrations and deflection chromatic aberrations are canceled out.

Let $\theta$ be the rotational angle of the third deflector relative to the second deflector. That is, the angular deviation between the senses of the deflection electrodes of the second and third deflectors, respectively, is $\theta$. The first and second deflectors have comatic aberration coefficients $L_1$ and $L_2$, respectively. The first and second deflectors have chromatic aberration coefficients $C_1$ and $C_2$, respectively. The third deflector shows a comatic aberration coefficient of $L_3$ and a chromatic aberration coefficient of $C_3$ under the condition where the angular distance of the third deflector from the second deflector is set to 0. $u_{i2}$ and $u_{i3}$ give complex representations of the beam incidence positions at an image plane of the objective lens when a unit deflection voltage is applied to the second and third deflectors, respectively, under the condition where the angular distance of the third deflector from the second deflector is set to 0. Preferably, the intensity distributions in the lens field and in the deflection field are so selected that a relationship $$0<\theta<2\arg(u_{i2}/u_{i3}) \text{ or } 0>\theta>2\arg(u_{i2}/u_{i3})$$

holds, where $\theta=\arg((L_1C_2-L_2C_1)/(L_3C_1-L_1C_3))$.

The intensity distribution in the deflection field is selected by adjusting the dimensions, positions, and angular positional relationships of the first, second, and third deflectors. Preferably, deflection signals entered respectively to the three deflectors are made equal to each other.

As described so far, in the charged-particle beam system according to the present invention, the three stages of deflectors are interlocked to simultaneously correct deflection comatic aberration and deflection chromatic aberration while determining the beam incidence position at the image plane of the objective lens. The first deflector is disposed in a stage preceding a demagnifying lens or close to the object plane of the objective lens. The second deflector is so disposed that the deflection field produced by it is totally or partially overlapped on the field produced by the objective lens. The third deflector is disposed in a stage following the second deflector.

Deflection voltages to the second and third deflectors are set equal to each other. That is, voltages applied to their deflection electrodes are set equal to each other.

Furthermore, intensity distributions in the lens field and in the deflection field are selected such that a relationship $$0<\theta<2\arg(u_{i2}/u_{i3}) \text{ or } 0>\theta>2\arg(u_{i2}/u_{i3})$$

holds. The third deflector is rotated relative to the second deflector by an angle $\theta$ determined by the deflection comatic aberration coefficients and deflection chromatic aberration coefficients of the first, second, and third deflectors. $u_{i2}$ and $u_{i3}$ are beam incidence positions at the image plane of the objective lens when a unit deflection voltage is applied to the second and third deflectors, respectively, under the condition where the angular positional deviation of the third deflector from the second deflector is set to 0.

In the charged-particle beam system according to the present invention, deflection comatic aberration and deflection chromatic aberration can be simultaneously corrected while determining a beam incidence position at the image plane of the objective lens without increasing the electrode length greatly, without reducing the inside diameter of the electrodes greatly, and without increasing the deflection voltage greatly.

Other objects and features of the invention will appear in the course of the description thereof, which follows.

DESCRIPTION OF THE PREFERRED EMBODIMENTS

Preferred embodiments of the present invention are hereinafter described with reference to the drawings. A first embodiment of the present invention is described first. The first embodiment provides an electron beam lithography system for writing a mask pattern onto a material by an electron beam, the mask pattern being used for a photomask used for semiconductor fabrication. The system is required to have nanometer-order accuracy in delineating a pattern having a linewidth of less than 1 μm within a deflection field measuring 1 mm×1 mm.

Figure 3:
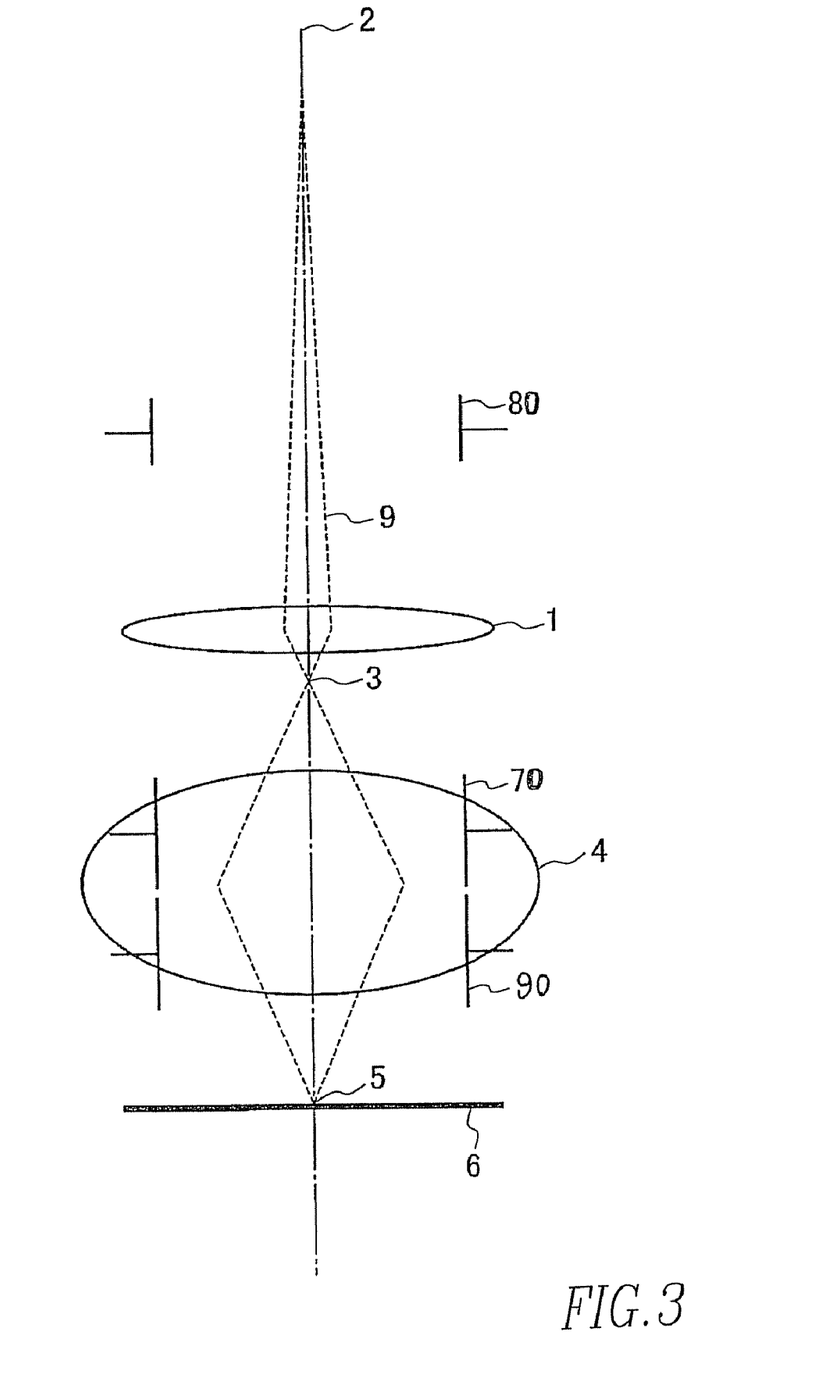
FIG. 3 is a schematic diagram of an electron beam lithography system according to one embodiment of the present invention.

FIG. 3 is a schematic diagram mainly showing the optical system of the electron beam lithography system. In both FIGS. 1 and 3, identical components are indicated by identical reference numerals. This electron beam lithography system has a demagnifying lens 1 for demagnifying dimensions of an electron beam 9 produced from an electron beam source 2, an objective lens 4 for focusing the beam whose dimensions have been reduced by the demagnifying lens 1 onto the surface of a target, a first deflector 80 located in a stage preceding the demagnifying lens 1, a second deflector 70 arranged such that a deflection field produced by the second deflector 70 itself is totally or partially overlapped onto the field produced by the objective lens 4, and a third deflector 90 disposed in a stage following the second deflector 70. An image 3 of the beam source (i.e., an object) 2 is created by the demagnifying lens 1. An image 5 of the image 3 is created on the surface of the material, or the target 6, by the objective lens 4. Of course, the magnification (absolute value) of the demagnifying lens 1 is set smaller than 1 to permit the beam (image 5) of microscopic cross section to hit the material 6.

Figure 4:
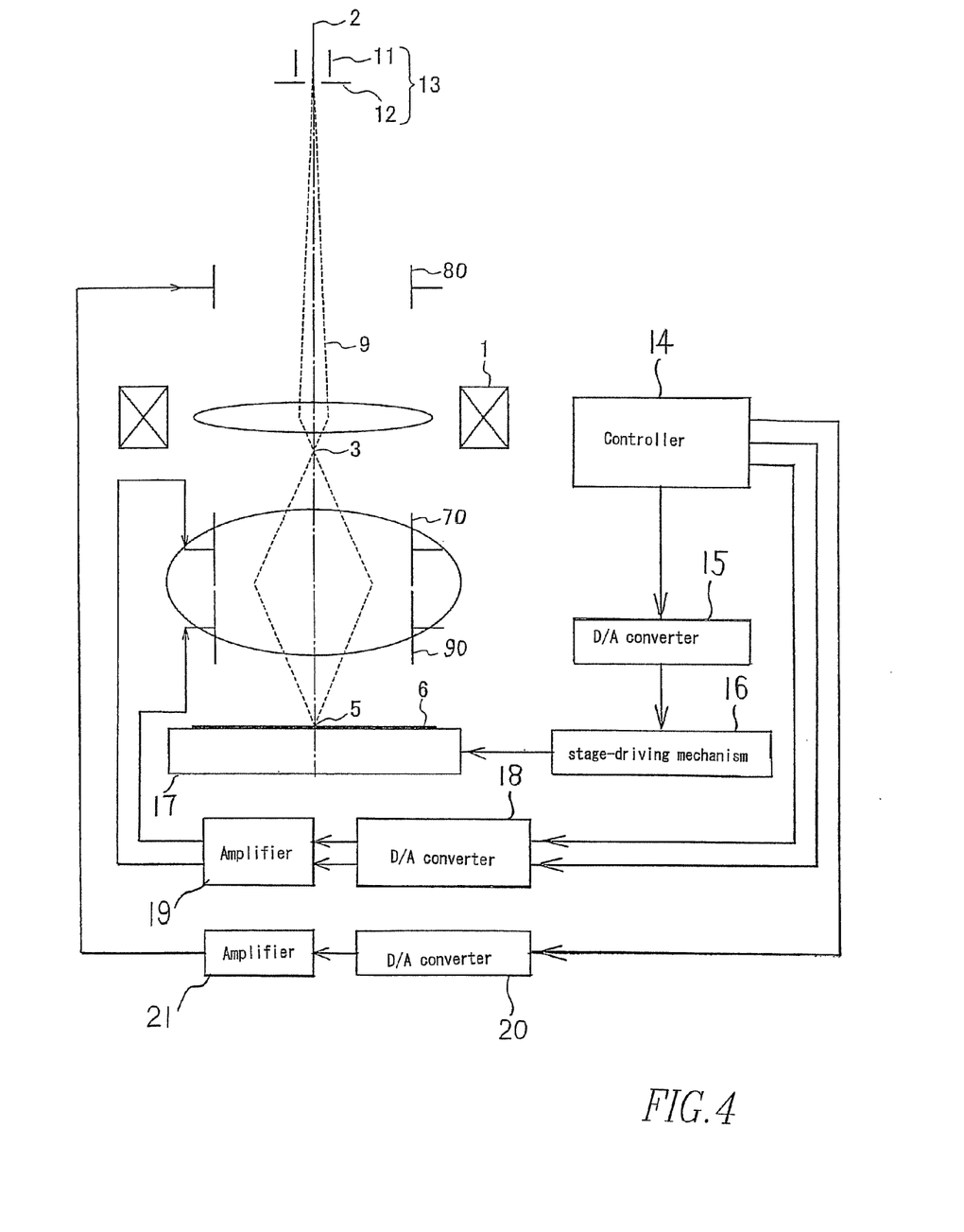
FIG. 4 is a diagram of an electron beam lithography system according to one embodiment of the present invention, particularly showing the configuration of the system.

FIG. 4 particularly shows the configuration of the electron beam lithography system. The electron beam produced from the electron beam source 2 is blanked by a blanking mechanism 13 consisting of a blanking deflector 11 and a blanking plate 12.

The material 6 is placed on a sample stage 17, which, in turn, is driven by a stage-driving mechanism 16.

A controller 14 feeds a stage-driving signal to the stage-driving mechanism 16 via a D/A converter 15. The controller 14 also supplies a deflection signal to the first deflector 80 via a D/A converter 20 and an amplifier 21, the deflection signal corresponding to data about the position at which a pattern is delineated. Furthermore, the controller 14 feeds a deflection signal to the second deflector 70 via a D/A converter 18 and another amplifier 19, the deflection signal corresponding to data about the position at which the pattern is delineated. In addition, the controller 14 feeds a deflection signal to the third deflector 90 via the D/A converter 18 and amplifier 19, the deflection signal corresponding to data about the position at which the pattern is delineated. The amplifier 19 is shared between the second deflector 70 and third deflector 90. Similarly, the D/A converter 18 is shared between the two deflectors.

In one feature of this electron beam lithography system, the first deflector 80 is located in a stage preceding the demagnifying lens 1, while the second deflector 70 and third deflector 90 are located in a stage following the demagnifying lens 1.

The intensity distribution in the deflection field is selected by adjusting the dimensions, positions, and deflection voltages of the first deflector 80, second deflector 70, and third deflector 90 to cancel out deflection comatic aberrations caused by the deflectors and, at the same time, cancel out deflection chromatic aberrations due to the deflectors while determining the position of the image 5.

Deflection signals entered respectively to the second deflector 70 and third deflector 90 are set equal to each other while satisfying the conditions under which deflection comatic aberrations and deflection chromatic aberrations are canceled out.

Let θ be the rotational angle of the third deflector 90 relative to the second deflector 70. That is, the angular deviation between the senses of the deflection electrodes of the second and third deflectors, respectively, is θ. The first and second deflectors have comatic aberration coefficients of $L_1$ and $L_2$, respectively. The first and second deflectors have chromatic aberration coefficients of $C_1$ and $C_2$, respectively. The third deflector 90 shows a comatic aberration coefficient of $L_3$ and a chromatic aberration coefficient of $C_3$ under the condition where the angular distance of the third deflector 90 from the second deflector 70 is set to 0. $u_{i2}$ and $u_{i3}$ give complex representations of beam incidence positions at the image plane of the objective lens 4 when a unit deflection voltage is applied to the second and third deflectors, 70 and 90, respectively, under the condition where the angular distance of the third deflector 90 from the second deflector 70 is set to 0. The intensity distributions in the lens field and deflection field are so selected that a relationship $$0<\theta<2\,\arg(u_{i2}/u_{i3}) \text{ or } 0>\theta>2\,\arg(u_{i2}/u_{i3})$$

holds, where $\theta=\arg((L_1C_2-L_2C_1)/(L_3C_1-L_1C_3))$.

The intensity distribution in the deflection field may be selected by adjusting the dimensions, positions, and relative angular positions of the first deflector 80, second deflector 70, and third deflector 90, and deflection signals respectively applied to the three deflectors may be made equal to each other.

The operation of the electron beam lithography system is described in detail below. When the three deflectors 80, 70, and 90 are interlocked, deflection comatic aberrations and deflection chromatic aberrations are superimposed and given by Eqs. (1) and (2).

$$\sum_{n=1}^{3}\left(L_n V_n U_0' \overline{U_0'} + R_n \overline{V_n} U_0'^2\right) \tag{1}$$

$$\sum_{n=1}^{3}\left(-C_n V_n \frac{\Delta V}{\hat{V}_0}\right) \tag{2}$$

In Eqs. (1) and (2), $U_0'$ and $\overline{U_0'}$ provide a complex representation of a beam angular aperture at the beam source 2. $L_n$ and $R_n$ (where n=1, 2, and 3 from the point closest to the beam source 2) give complex representations of the deflection comatic aberration coefficients of the deflectors. $C_n$ gives a complex representation of deflection chromatic aberrations. $V_n$ gives a complex representation of a deflection voltage and is defined by Eq. (3).

$$V_n = V_{nx} + V_{ny} \tag{3}$$

where $V_{nx}$ and $V_{ny}$ are voltages applied to deflection electrodes of each deflector for deflection along the X- and Y-axes, respectively. $\Delta V$ is the energy dispersion of electrons. $\hat{V}_0$ is the accelerating voltage modified relativistically. A conditional expression stating conditions under which deflection comatic aberrations due to the three interlocking deflectors are canceled out is given by Eq. (4). A conditional expression stating conditions under which deflection chromatic aberrations are canceled out is given by Eq. (5).

$$\sum_{n=1}^{3}\left(L_n V_n U_0' \overline{U_0'} + R_n \overline{V_n} U_0'^2\right) = 0 \quad (4)$$

$$\sum_{n=1}^{3}\left(-C_n V_n \frac{\Delta V}{\hat{V}_0}\right) = 0 \quad (5)$$

Because of the nature of comatic aberrations, if the term of $L_n$ is corrected, the term of $R_n$ is automatically corrected. Therefore, conditions given by Eq. (4) are simplified into the form given by Eq. (6).

$$\sum_{n=1}^{3} L_n V_n U_0' \overline{U_0'} = 0 \quad (6)$$

The higher-order component of the deflection field is neglected here, assuming that the electric field distribution within the X-Y plane is uniform. That is, in practical applications, use of octopole or dodecapole (12-pole) deflectors from which the higher-order component (hexapole component) has been removed is contemplated as each deflector.

Usually, $U_0' \neq 0$ and $\Delta V \neq 0$. Therefore, if Eqs. (5) and (6) are simplified, conditions under which deflection comatic aberration and deflection chromatic aberration are simultaneously canceled out (i.e., corrected) can be given by Eq. (7). A relationship given by Eq. (8) can be derived from Eq. (7).

$$\begin{cases} \sum_{n=1}^{3} L_n V_n = 0 \\ \sum_{n=1}^{3} C_n V_n = 0 \end{cases} \quad (7)$$

$$\begin{cases} V_1 = A_1 V_2 \\ V_3 = A_3 V_2 \end{cases} \quad (8)$$

where $A_1$ and $A_3$ have a relationship as given by Eq. (9).

$$\begin{cases} A_1 = \frac{L_2 C_3 - L_3 C_2}{L_3 C_1 - L_1 C_3} \\ A_3 = \frac{L_1 C_2 - L_2 C_1}{L_3 C_1 - L_1 C_3} \end{cases} \quad (9)$$

When the three deflectors are interlocked, a complex representation of the position of the image 5 at the surface of the material 6 can be given by Eq. (10).

$$U_i = \sum_{n=1}^{3} u_{in} V_n \quad (10)$$

In Eq. (10), $u_{in}$ gives a complex representation of the position of the image 5 at the surface of the material 6 when a unit voltage $V_n = 1$ V ($V_{nx} = 1$ V, $V_{ny} = 0$ V) is applied to each deflector.

Any one or both of the second deflector 70 and the third deflector 90 play a role for positioning purposes. Therefore, any one or both of $|V_2|$ and $|V_3|$ are set sufficiently large as long as the output from a high-speed amplifier driving both deflectors permits. The inside diameter of each deflector is set as large as possible to minimize adhesion of contaminants on the deflectors and charging. Furthermore, because the first deflector 80 interlocks with the second deflector 70 and third deflector 90, the deflection speed of the first deflector 80 must be equal to the deflection speed of the second and third deflectors, 70 and 90. Consequently, the first deflector 80 is driven by a high-speed amplifier in the same way as the second and third deflectors, 70 and 90. For these reasons, it is normally unlikely that $|V_1| > |V_2|$ or that $|V_1| > |V_3|$. In addition, the first deflector 80 is located in a stage preceding the demagnifying lens 1. Alternatively, the first deflector may be close to the object plane of the objective lens 4. The second deflector 70 and third deflector 90 are located in a stage following the object plane of the objective lens 4. Therefore, $|u_{i1}|$ is smaller than $|u_{i2}|$ and $|u_{i3}|$. In consequence, $|u_{i1} V_1|$ is sufficiently smaller than $|u_{i2} V_2|$ and $|u_{i3} V_3|$. Accordingly, if $u_{i1} V_1$ is neglected in Eq. (10), Eq. (10) can be rewritten into the form:

$$U_i = u_{i2} V_2 + u_{i3} V_3 \quad (11)$$

Before the second deflector 70 and third deflector 90 are operated in a non-interlocking manner, that is, when only one deflector is disposed in a lens-field produced by the objective lens (i.e., any one of deflection comatic aberration and deflection chromatic aberration is corrected or none of them are corrected), it follows that $V_2 = V_3$. Therefore, using Eq. (11), the position $U_{ic}$ of the image 5 at the surface of the material 6 assumed before the deflectors are operated in a non-interlocking manner is given by $$U_{ic} = u_{i2} V_2 + u_{i3} V_2 = (u_{i2} + u_{i3}) V_2 \quad (12)$$

Meanwhile, using Eqs. (8) and (11), the position of the image 5 assumed when the deflectors are operated in a non-interlocking manner, that is, when two deflectors 70 and 90 are disposed in a lens field produced by the objective lens (i.e., simultaneous correction of deflection comatic aberration and deflection chromatic aberration) is given by the following Eq. (13).

$$U_i = u_{i2} V_2 + u_{i3} V_3 = (u_{i2} + A_3 u_{i3}) V_2 \quad (13)$$

If $A_3$ is expressed by $A_3 = |A_3| \exp(i\theta)$, we obtain $$U_i = u_{i2} V_2 + (u_{i3} \exp(i\theta))(|A_3| V_2) \quad (14)$$

This Eq. (14) can be interpreted as the position of the image 5 at the surface of the material 6 when the third deflector 90 is mechanically rotated through $\theta$ relative to the second deflector 70 and the deflection voltage on the third deflector 90 is increased by a factor of $|A_3|$. That is, varying the sense of $A_3$ electrically is equivalent to varying the sense of $A_3$ mechanically.

Figure 5A:
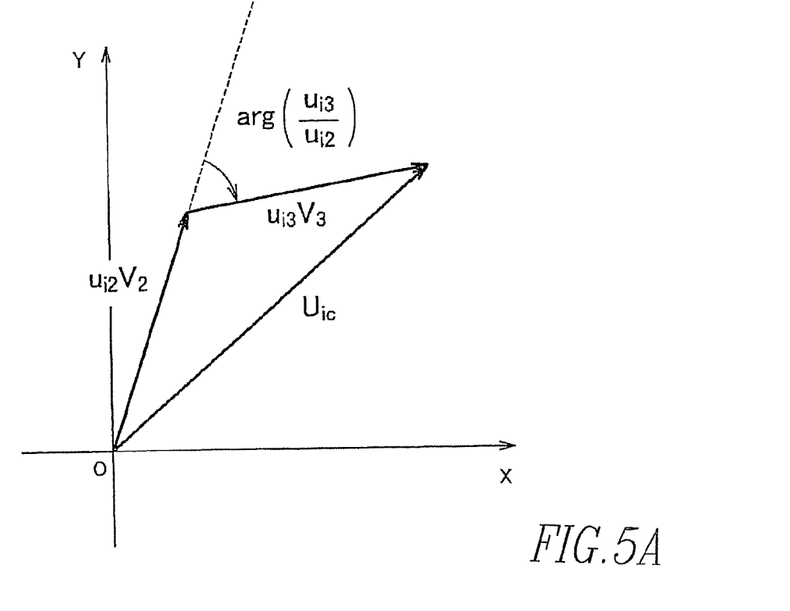
FIGS. 5A and 5B show graphs indicating the position of an image 5 (electron beam incidence position) at the surface of a material 6.
Figure 5B:
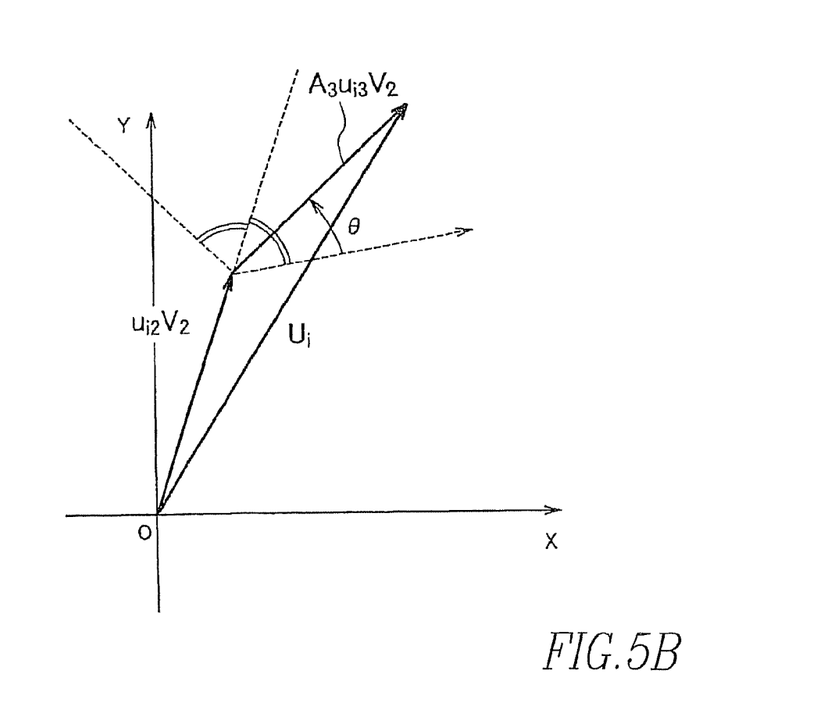

$U_{ic}$ and $U_i$ are shown in FIGS. 5A and 5B. To vary the sense of $U_i$, three deflectors are rotated while maintaining their angular positional relationships. Therefore, when $U_i$ is discussed, one should take notice of the magnitude $|U_i|$. Accordingly, the conditions under which $|U_i|$ is made as large as possible are discussed below. Conditions under which $|U_i|$ is made as large as possible for the same deflection voltage are equivalent to conditions under which the deflection voltage is reduced as low as possible for the same $|U_i|$. The purpose of the present invention can be accomplished by finding such conditions.

As can be seen from Eq. (14) and FIGS. 5A and 5B, $|U_i|$ can be increased if $|\arg(u_{i3}/u_{i2})+\theta|$ is reduced as much as possible and $|A_3|$ is increased. However, as described previously, $|V_2|$ has been already set sufficiently large and so it is impossible to realize $|A_3|>1$. Therefore, the best solution is to achieve $|A_3|=1$. Furthermore, $A_3=1$ can be accomplished by mechanically rotating the third deflector 90 relative to the second deflector 70 through $\theta$ under the condition where $|A_3|=1$. Therefore, the same deflection signal can be applied to both deflectors. That is, there is another advantage that both deflectors can be driven and controlled by the same amplifier 19 and D/A converter 18.

$|u_{i2}|$ and $|u_{i3}|$ remain the same if the deflectors are rotated. Therefore, if $|A_3|$ is kept at 1 ($|A_3|=1$), $|U_i|$ and $|U_{ic}|$ are determined by the angle arc $(u_{i3}/u_{i2})$ formed between $u_{i2}$ and $u_{i3}$. If $|U_i|<|U_{ic}|$, the required deflection voltage becomes higher than the voltage assumed before the deflectors are operated in a non-interlocking manner (that is, when only one deflector is disposed in a lens field produced by the objective lens) and, therefore, $L_n$, $R_n$, and $C_n$ (n=1, 2, 3) are so selected that at least $|U_i|>|U_{ic}|$ is achieved. That is, the intensity distributions in the lens field and in the deflection field are determined.

It can be seen from FIG. 5 that conditions under which $|U_i|>|U_{ic}|$ is achieved are $$\arg(u_{i3}/u_{i2})<\arg(u_{i3}/u_{i2})+\theta<-\arg(u_{i3}/u_{i2})$$

i.e., $(\arg(u_{i2}/u_{i3})=-\arg(u_{i3}/u_{i2}))$ that is $0<\theta<2\arg(u_{i3}/u_{i2})$.

At this time, the sense of the third deflector 90 rotated relative to the second deflector 70 becomes coincident with the sense of the orbit of the electron beam 9 rotated by the lens magnetic field. Furthermore, when $\theta=\arg(u_{i2}/u_{i3})$, $|U_i|$ maximizes.

It is assumed here that the orbit of the electron beam 9 is rotated by the lens magnetic field in a rightward direction (the sense of a right-handed screw; counterclockwise direction in FIG. 4) with progress of electrons. If the sense of rotation of the orbit is opposite, the above-described conditions are modified to $\arg(u_{i3}/u_{i2})>\arg(u_{i3}/u_{i2})+\theta>-\arg(u_{i3}/u_{i2})$, i.e., $0>\theta>2\arg(u_{i2}/u_{i3})$.

In the above embodiment, it is assumed that there is no gap between the second deflector 70 and the third deflector 90. If the deflectors are operated in a non-interlocking manner (that is, if two deflectors are disposed in a lens field produced by the objective lens) and rotated, it is necessary in practice to form a gap between them for electrical insulation. Furthermore, support members in the form of flat plates are necessary between the deflectors operated in a non-interlocking manner to support the deflection electrodes and a rod-like member for blocking an electric field (see, for example, JP2-100250). Therefore, the gap must be increased accordingly.

Because of spatial restrictions, if the position of the upper end of the second deflector 70 and the position of the lower end of the third deflector 90 are not varied, the total deflector length is urged to be made smaller than before the non-interlocked operation due to the gap. That is, if the deflectors are operated in a non-interlocking manner (that is, if two deflectors are disposed in a lens field produced by the objective lens), $|U_i|$ is reduced by an amount corresponding to the decrease in the deflector length. When $L_n$, $R_n$, and $C_n$ (n=1, 2, 3) are so selected that $0<\theta<2\arg(u_{i2}/u_{i3})$ or $0>\theta>2\arg(u_{i2}/u_{i3})$ is achieved, i.e., when the intensity distributions in the lens field and in the deflection field are selected, it is better to take account of compensation for the decrease.

As described previously, in order to lower the deflection voltage on the deflector for aberration correction, it is advantageous to place the deflector in a stage preceding the demagnifying lens 1. However, if both the first deflector 80 and second deflector 70 are disposed in a stage preceding the demagnifying lens 1 and the third deflector 90 is placed in a stage following the lens 1, the following problem takes place. The first deflector 80 and second deflector 70 are close in aberrational characteristics. More specifically, both deflectors are close in the ratio of deflection comatic aberration to deflection chromatic aberration. A state close to $L_1/C_1=L_2/C_2$ is achieved, for the following reason. Where the electron beam 9 is deflected by the deflector located in a stage preceding the demagnifying lens 1, the position of the image 3 of the beam source 2 at the image plane of the demagnifying lens 1 hardly depends on the dimensions or position of the deflector because of low magnification of the demagnifying lens 1. That is, the profile of the deflection orbit assumed after passage through the field of the demagnifying lens 1 hardly depends on the dimensions or position of the deflector, though the distance of the orbit from the center axis varies. If deflection comatic aberration and deflection chromatic aberration are corrected simultaneously, the relationship $V_2=V_3/A_3$ must be satisfied, as can be seen from Eq. (8). However, if a state close to $L_1/C_1=L_2/C_2$, i.e., $L_1C_2-L_2C_1=0$, is achieved, $A_3$ approaches zero. As a result, $|V_2|>>|V_3|$.

A sufficiently high deflection voltage is applied to permit the third deflector 90 to play a role for positioning. This relationship indicates that a still higher deflection voltage needs to be applied to the second deflector 70. The relationship $|V_1|>|V_3|$ can hold unless $|A_1|<<1$. However, because of the requirement on the deflection speed, it is impossible to have a relationship $|V_2|>|V_3|$ or $|V_1|>|V_3|$. Consequently, this arrangement must be avoided. For the same reason, an arrangement in which the first deflector 80 is placed in a stage preceding the demagnifying lens 1 and the second deflector 70 is placed near the object plane (image plane of the demagnifying lens 1) of the objective lens 4 should be avoided. In addition, it is better to avoid an arrangement in which both first deflector 80 and second deflector 70 are placed near the object plane of the objective lens 4.

Conversely, in order to give a difference in aberrational characteristics between the first deflector 80 and the second deflector 70, i.e., to avoid a state close to $L_1/C_1=L_2/C_2$, it is better to place the first deflector 80 either in the stage preceding the demagnifying lens 1 or close to the object plane of the objective lens 4 (image plane of the demagnifying lens 1) and to place the second deflector 70 within the field of the objective lens 4 as shown in FIG. 3. The components are so arranged that at least a part of the deflection field produced by the second deflector 70 overlaps the field produced by the objective lens 4. The orbit of the electron beam 9 is bent by deflectors, and the deviation of the orbit from the center axis of the lens increases within the lens field. This increases deflection aberrations. Therefore, the interval in which aberrations are increased can be varied by changing the position at which the orbit begins to be bent. As a result, the aberrational characteristics (ratio of deflection comatic aberration to deflection chromatic aberration) of the deflectors are varied.

Because of the optical arrangement and operating conditions as described so far, deflection comatic aberration and deflection chromatic aberration can be simultaneously corrected while determining the position of the image 5 without increasing the deflection voltage, without increasing the deflector length, and without reducing the inside diameter of each deflector.

As described previously, both third deflector 90 and second deflector 70 can be driven and controlled by the same amplifier and the same D/A converter by mechanically rotating the third deflector 90 relative to the second deflector 70 through angle θ and establishing the relationship $A_3=1$. This method is extended as follows. If the dimensions, position, and angular position of the first deflector 80 are so selected that all the three deflectors are made equal in deflection voltage ($A_1=A_3=1$), all the deflectors can be driven and controlled by the same amplifier and the same D/A converter.

To demonstrate the actual presence of conditions under which $0<\theta<2 \arg(u_{i3}/u_{i2})$ or $0>\theta>2 \arg(u_{i2}/u_{i3})$ holds when deflection comatic aberration and chromatic aberration are simultaneously corrected, we made simulations of correction of aberrations in a focusing and deflection system using three stages of deflectors as in the optical system shown in FIG. 3. It was assumed that the intensity distribution in the field produced by the demagnifying lens 1 was fixed. Calculations were performed with various intensity distributions in the field produced by the objective lens 4 and with various intensity distributions in the deflection field. The intensity distribution in the field produced by the objective lens 4 and the intensity distribution in the deflection field were taken as virtual distributions. The distributions are given by superimposition of analytical functions. The strength of the deflection field relative to the deflection voltage was matched to the results of numerical calculations about a deflector having a sufficiently large length and an inside diameter of 9 mm. The lengths of the deflectors were so selected that the relationship $|A_1|=|A_3|=1$ holds. The position of the upper end of the second deflector 7 and the position of the lower end of the third deflector 90 were not varied. The gap between both deflectors was set to 3 mm. The position of the beam source 2 was given by z=−220 mm. The position of the surface of the material 6 was given by z=0 mm. The projection magnification was set to 1/20.

Figure 6A:
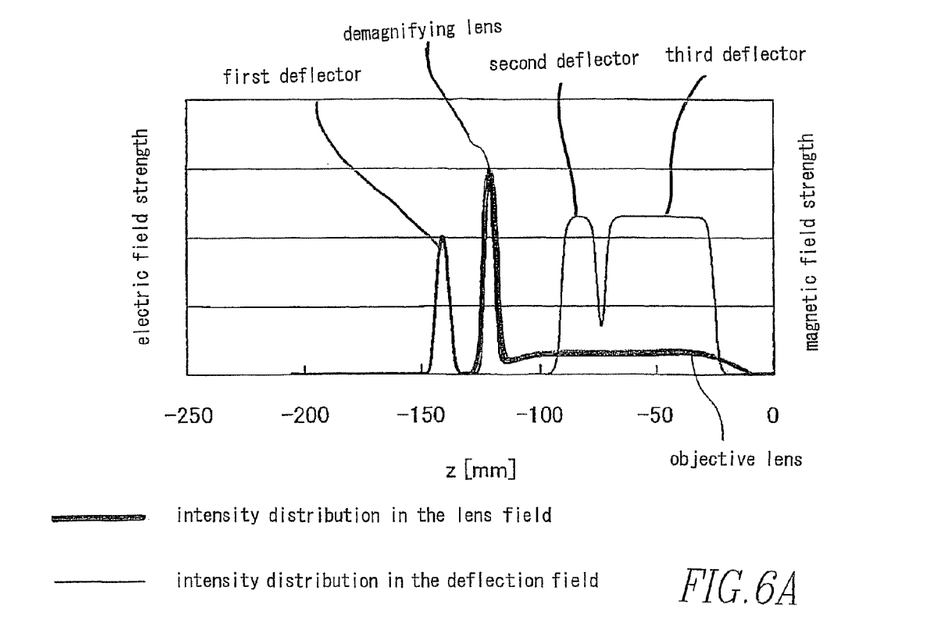
FIGS. 6A and 6B show graphs indicating intensity distributions in lens fields and in deflection fields.
Figure 6B:
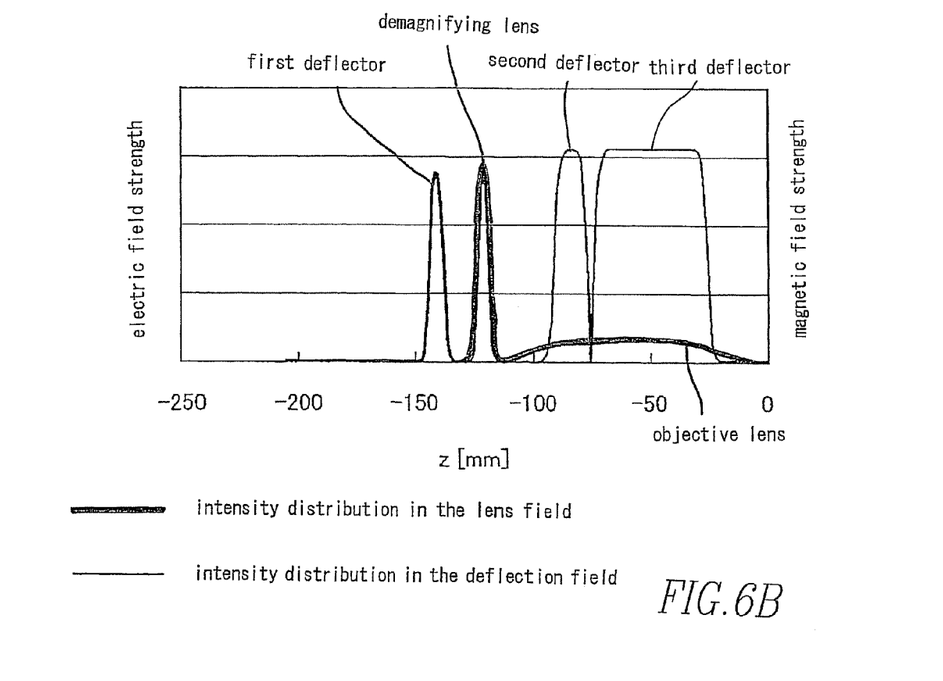

The results of the simulations are shown in Table 1 and FIGS. 6A and 6B. Table 1 shows the computationally obtained values of $u_{i2}$, $u_{i3}$, $2 \arg(u_{i2}/u_{i3})$, θ, and deflection voltages. FIGS. 6A and 6B show intensity distributions in the lens field and in the deflection field. In each graph, the vertical axis indicates the magnetic field strength and the electric field strength. The horizontal axis indicates the position z (mm). For comparison, results obtained from optical systems (a) and (b) (see Table 1) in which the field produced by the objective lens 4 was varied are shown.

TABLE 1

|  | optical system (a) | optical system (b) |
|---|---|---|
| $u_{i2}$ (in μm) | (−41, 159) | (−37, 186) |
| $u_{i3}$ (in μm) | (325, 442) | (516, 601) |
| $2 \arg(u_{i2}/u_{i3})$ (in degrees) | 101 | 104 |
| θ (in degrees) | 73 | 178 |
| during non-interlocked operation of deflectors $|V_2|$ (= $|V_3|$) (in V) | 155 | 210 |
| before non-interlocked operation of deflectors $|V_2|$ (in V) | 157 | 154 |

The deflection voltages shown in Table 1 were used to move the image 5 on the surface of the material 6 a distance of 500 μm in the X- and Y-directions. That is, the voltages were used to move the image a distance of 707 μm (=500×√2) in a direction spaced from the X-axis by 45°.

Comparison of the deflection voltages used prior to the non-interlocked operation of the deflectors reveals that the deflection voltages for both optical systems were about 155 V and nearly equal to each other. However, when the deflectors were operated in a non-interlocking manner (that is, two deflectors are disposed in a lens field produced by the objective lens), a great difference was produced between them. During the non-interlocked operation, in the optical system (a), the relationship $0<\theta<2 \arg(u_{i2}/u_{i3})$ holds. The deflection voltage was 155 V, which was lower than the deflection voltage of 157 V produced before the non-interlocked operation of the deflectors in spite of the fact that there was a gap between the second deflector 70 and the third deflector 90. On the other hand, in the optical system (b), the relationship $0<2 \arg(u_{i2}/u_{i3})<\theta$ holds. The deflection voltage was 210 V, which was much greater than the deflection voltage of 154 V applied before the non-interlocked operation of the deflectors.

Figure 7:
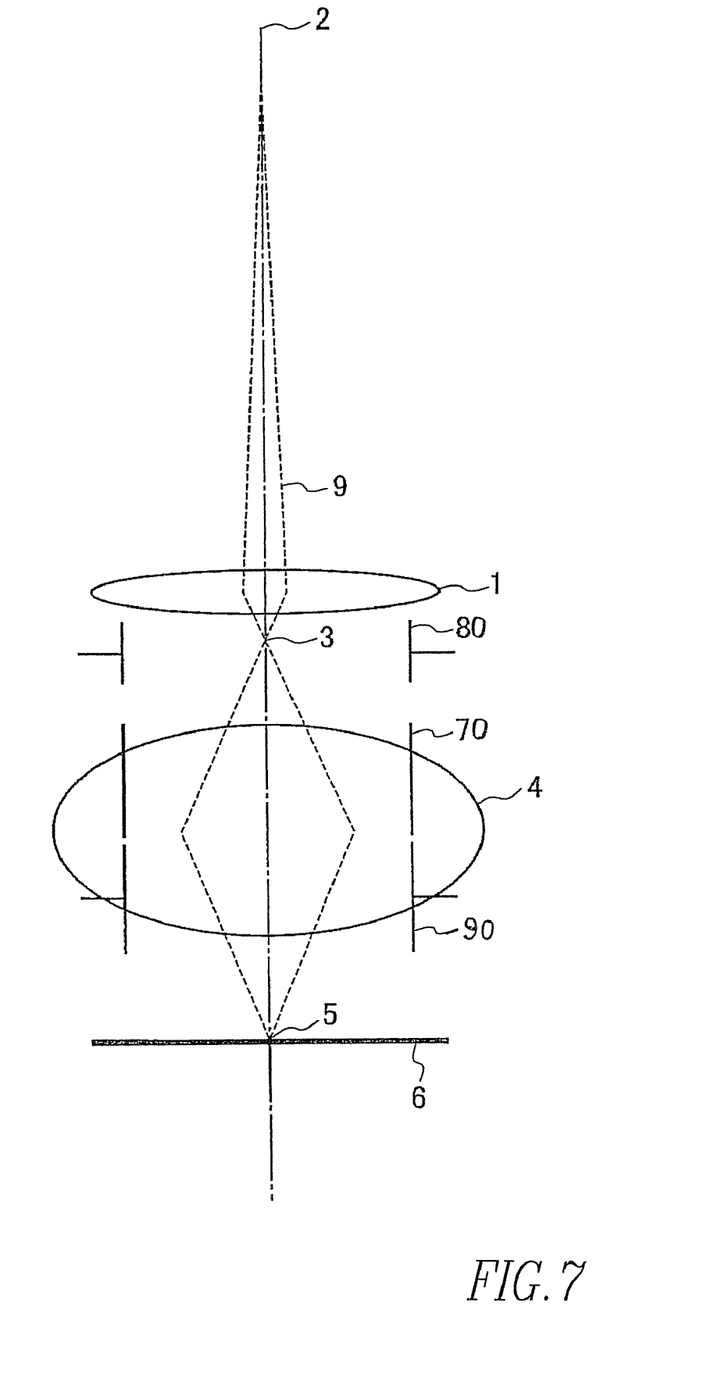
FIG. 7 is a schematic diagram of an electron beam lithography system according to another embodiment of the present invention.

A second embodiment of the present invention is next described. This embodiment also provides an electron beam lithography system. FIG. 7 is a schematic diagram showing mainly the optical system of the electron beam lithography system. In FIGS. 3 and 7, identical components are indicated by identical reference numerals.

The second embodiment is similar to the first embodiment except for the arrangement of the first deflector 80. The first deflector 80 is disposed close to the demagnifying lens 1. In particular, the first deflector 80 is placed between the demagnifying lens 1 and the second deflector 70 and close to the image 3.

The second embodiment is similar in operation with the first embodiment. Therefore, description of the operation of the second embodiment is omitted.

The present invention can be applied to the aforementioned electron beam lithography system. In addition, the invention can be applied to charged-particle beam systems such as other electron beam systems (e.g., SEM) and ion beam systems (e.g., focused ion beam system).

As described so far, a charged-particle beam focusing and deflecting system is offered which has three stages of interlocking deflectors and in which deflection comatic aberration and deflection chromatic aberration are simultaneously corrected. In this system, a first deflector is placed in a stage preceding a demagnifying lens or close to the object plane of an objective lens. A second deflector is disposed such that a deflection field produced by the second deflector is totally or partially overlapped on the field of the objective lens. A third deflector is disposed in a stage following the second deflector.

The same deflection voltage is applied to the second and third deflectors. This means that the same voltage is applied to their deflection electrodes. That is, the deflectors are driven by one amplifier.

The intensity distributions in the lens field and deflection field are so selected that a relationship $0<\theta<2 \arg(u_{i2}/u_{i3})$ or $0>\theta>2 \arg(u_{i2}/u_{i3})$ holds. The third deflector is rotated relative to the second deflector by angle θ determined by the deflection comatic aberration coefficients and deflection chromatic aberration coefficients of the first, second, and third deflectors. $u_{i2}$ and $u_{i3}$ are beam incidence positions at the image plane of the objective lens when a unit deflection voltage is applied to the second and third deflectors, respectively, under the condition where the angular distance of the third deflector from the second deflector is set to 0.

These contrivances make it possible to correct deflection comatic aberration and deflection chromatic aberration at the same time while determining the beam incidence position at the image plane of the objective lens without increasing the electrode length so much, without reducing the inside diameter of each electrode greatly, and without increasing the deflection voltage greatly.

The configuration particularly shown in FIG. 4 can also be applied to the second embodiment. Furthermore, in either embodiment, the amplifier 19 and D/A converter 18 can be shared between the second deflector 70 and third deflector 90. The same voltage can be applied to the deflection electrodes of the second and third deflectors. Additionally, the amplifier 21 and D/A converter 20 connected with the first deflector 80 may be made common with the amplifier 19 and D/A converter 18 for the second deflector 70 and third deflector 90.

Having thus described my invention with the detail and particularity required by the Patent Laws, what is desired protected by Letters Patent is set forth in the following claims.

The invention claimed is:

1. A charged-particle beam system comprising:
a charged-particle beam source for producing a charged-particle beam;
a demagnifying lens for demagnifying dimensions of the charged-particle beam produced from the charged-particle beam source;
an objective lens for focusing the charged-particle beam whose dimensions have been demagnified by the demagnifying lens onto a surface of a target;
a first deflector for producing a deflection field disposed in a stage preceding the demagnifying lens or close to an object plane of the objective lens;
a second deflector for producing a deflection field placed such that a deflection field produced by the second deflector itself is totally or partially superimposed on a lens field produced by the objective lens; and
a third deflector for producing a deflection field disposed in a stage following the second deflector,
wherein intensity distribution in the deflection field is selected by adjusting dimensions, positions, and deflection voltages of said first, second, and third deflectors such that deflection comatic aberrations arising from the deflectors cancel each other out and, at the same time, deflection chromatic aberrations arising from the deflectors cancel each other out while determining a beam incidence position at an image plane of the objective lens.

2. A charged-particle beam system as set forth in claim 1, wherein a common deflection signal is applied to said second and third deflectors.

3. A charged-particle beam system as set forth in claim 1 or 2, wherein said second and third deflectors have deflection electrodes angularly spaced from each other by $\theta°$, and
wherein when (i) the first and second deflectors have comatic aberration coefficients of $L_1$ and $L_2$, respectively, (ii) the first and second deflectors have chromatic aberration coefficients of $C_1$ and $C_2$, respectively, and (iii) the third deflector shows a comatic aberration coefficient of $L_3$ and a chromatic aberration coefficient of $C_3$ under the condition where the third deflector is angularly spaced from the second deflector by $0°$, intensity distributions in the lens field and in the deflection field are so selected that a relationship $0<\theta<2 \arg(u_{i2}/u_{i3})$ or $0>\theta>2 \arg(u_{i2}/u_{i3})$ holds when a relationship $\theta=\arg((L_1C_2-L_2C_1)/(L_3C_1-L_1C_3))$ is established, where $u_{i2}$ and $u_{i3}$ give complex representations of beam incidence positions at an image plane of the objective lens when a unit deflection voltage is applied to the second and third deflectors, respectively, under the condition where the third deflector is angularly spaced from the second deflector by $0°$.

4. A charged-particle beam system as set forth in claim 1, wherein the intensity distribution in the deflection field is selected by adjusting dimensions, positions, and relative angular positions of said first, second, and third deflectors to make equal deflection signals applied to the three deflectors.

5. A charged-particle beam system as set forth in claim 3, wherein the intensity distribution in the deflection field is selected by adjusting dimensions, positions, and relative angular positions of said first, second, and third deflectors to make equal deflection signals applied to the three deflectors.

* * * * *